US007863083B2

(12) United States Patent
Amos et al.

(10) Patent No.: US 7,863,083 B2
(45) Date of Patent: Jan. 4, 2011

(54) HIGH TEMPERATURE PROCESSING COMPATIBLE METAL GATE ELECTRODE FOR PFETS AND METHODS FOR FABRICATION

(75) Inventors: Ricky Amos, Rhinebeck, NY (US); Douglas A. Buchanan, Cortlandt Manor, NY (US); Cyril Cabral, Jr., Ossining, NY (US); Alessandro C. Callegari, Yorktown Heights, NY (US); Supratik Guha, Chappaqua, NY (US); Hyungjun Kim, Fishkill, NY (US); Fenton R. McFeely, Ossining, NY (US); Vijay Narayanan, New York, NY (US); Kenneth P. Rodbell, Sandy Hook, CT (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/197,845

(22) Filed: Aug. 25, 2008

(65) Prior Publication Data

US 2008/0311745 A1 Dec. 18, 2008

Related U.S. Application Data

(62) Division of application No. 09/995,031, filed on Nov. 29, 2001, now abandoned.

(51) Int. Cl.
*H01L 21/00* (2006.01)
*H01L 21/76* (2006.01)
*H01L 21/266* (2006.01)
*H01L 21/425* (2006.01)

(52) U.S. Cl. .................. 438/98; 438/453; 438/523; 438/533

(58) Field of Classification Search .............. 438/680, 438/98, 453, 523, 533, FOR. 196
See application file for complete search history.

(56) References Cited

U.S. PATENT DOCUMENTS

| 5,514,628 | A | * | 5/1996 | Enomoto et al. | 438/6 |
| 5,789,312 | A | * | 8/1998 | Buchanan et al. | 438/585 |
| 5,895,274 | A | * | 4/1999 | Lane et al. | 438/795 |
| 6,008,091 | A | * | 12/1999 | Gregor et al. | 438/261 |
| 6,040,610 | A | | 3/2000 | Noguchi et al. | |

(Continued)

FOREIGN PATENT DOCUMENTS

JP 3-227562 10/1991

(Continued)

*Primary Examiner*—Ha Tran T Nguyen
*Assistant Examiner*—Karen M Kusumakar
(74) *Attorney, Agent, or Firm*—Scully, Scott, Murphy & Presser, P.C.; Vazken Alexanian (57) ABSTRACT

A method for fabricating a CMOS gate electrode by using Re, Rh, Pt, Ir or Ru metal and a CMOS structure that contains such gate electrodes are described. The work functions of these metals make them compatible with current pFET requirements. For instance, the metal can withstand the high hydrogen pressures necessary to produce properly passivated interfaces without undergoing chemical changes. The thermal stability of the metal on dielectric layers such as $SiO_2$, $Al_2O_3$ and other suitable dielectric materials makes it compatible with post-processing temperatures up to 1000° C. A low temperature/low pressure CVD technique with $Re_2(CO)_{10}$ as the source material is used when Re is to be deposited.

18 Claims, 4 Drawing Sheets

U.S. PATENT DOCUMENTS

| | | | |
|---|---|---|---|
| 6,043,536 A | 3/2000 | Numata et al. | |
| 6,238,933 B1 | 5/2001 | Sun et al. | |
| 6,248,673 B1 * | 6/2001 | Huang et al. | 438/787 |
| 6,300,208 B1 * | 10/2001 | Talwar et al. | 438/308 |
| 6,326,258 B1 * | 12/2001 | Iizuka | 438/239 |
| 6,376,349 B1 * | 4/2002 | Tobin et al. | 438/592 |
| 6,403,997 B1 | 6/2002 | Inumiya et al. | |
| 6,458,695 B1 | 10/2002 | Lin et al. | |
| 6,476,454 B2 | 11/2002 | Suguro | |
| 6,512,297 B2 | 1/2003 | Matsuno et al. | |
| 6,514,843 B2 | 2/2003 | Dokumaci et al. | |
| 6,541,320 B2 | 4/2003 | Brown et al. | |
| 6,614,079 B2 | 9/2003 | Lee et al. | |
| 6,664,186 B1 | 12/2003 | Callegari et al. | |
| 6,984,591 B1 * | 1/2006 | Buchanan et al. | 438/778 |
| 2001/0032995 A1 | 10/2001 | Maria et al. | |
| 2002/0155689 A1 * | 10/2002 | Ahn et al. | 438/592 |
| 2003/0011080 A1 | 1/2003 | Deshpande et al. | |
| 2004/0080001 A1 | 4/2004 | Takeuchi et al. | |

FOREIGN PATENT DOCUMENTS

| | | |
|---|---|---|
| JP | 8-102247 | 4/1996 |
| JP | 10-135452 | 5/1998 |
| JP | 11-243195 | 9/1999 |
| JP | 2000-252370 | 9/2000 |

* cited by examiner

HIGH TEMPERATURE PROCESSING COMPATIBLE METAL GATE ELECTRODE FOR PFETS AND METHODS FOR FABRICATION

RELATED APPLICATION

This application is a division of U.S. application Ser. No. 09/995,031, filed Nov. 29, 2001.

FIELD OF THE INVENTION

The present invention generally relates to a metal gate electrode for p-type field effect transistors and a method for fabricating the electrode and more particularly, relates to a metal gate electrode that is compatible with high temperature processing of p-type FETs and a method for fabricating the electrode.

BACKGROUND OF THE INVENTION

In the fabrication of complimentary metal oxide semiconductor (CMOS) integrated circuit devices with metal gates, deposition methods for the gate metals which include thermal evaporation (from Knudsen cells) and chemical vapor deposition are preferable since they lead to minimal gate dielectric damage and minimal long-term reliability problems. Other physical vapor deposition processes such as sputtering and e-beam evaporation lead to gate dielectric damage which is thought to be a long-term reliability problem even if some damage may be repaired by a forming gas or by a hydrogen anneal treatment. In general, chemical vapor deposition has the advantage over thermal evaporation in that it can be used to fill higher aspect ratio damascene features allowing for a wider variety of metal gate integration schemes.

While the deposition of Re metal by using a chemical vapor deposition technique has been attempted by others in the art, the deposited Re films using a halide precursor causes problems of halogen incorporation and high growth temperatures. Other attempts to grow Re films by using $Re_2(CO)_{10}$ as a precursor resulted in films with high carbon concentrations.

Despite the potential use of rhenium carbonyl in semiconductor applications, there is no disclosure of using $Re_2(CO)_{10}$ as the CVD source material for providing p-channel Re gates on dielectric materials such as ultra-thin (i.e. <50 Å) gate dielectric materials.

It is therefore an object of the present invention to provide a method for fabricating a metal oxide semiconductor (MOS) device with Re gate electrodes that do not have the drawbacks or shortcomings of the conventional methods.

It is another object of the present invention to provide a method for fabricating a metal oxide semiconductor device with gate electrodes fabricated from a metal selected from Re, Rh, Pt, Ir and Ru.

It is a further object of the present invention to provide a method for fabricating a field effect transistor encompassing gate electrodes fabricated of Re, Rh, Ir, Pt or Ru that has a work function compatible with pFET requirements.

It is another further object of the present invention to provide a field effect transistor equipped with gate electrodes formed of a metal that can withstand high hydrogen pressures necessary for producing proper passivated interfaces without undergoing chemical changes.

It is still another object of the present invention to provide a method for fabricating a field effect transistor equipped with gate electrodes that are compatible with post processing temperatures of up to 1000° C.

SUMMARY OF THE INVENTION

The invention provides a method for fabricating a CMOS gate electrode by using a Re, Rh, Pt, Ir or Ru metal. The work functions of these metals make them compatible with current pFET requirements. For instance, when Re is used, it can withstand the high hydrogen pressures necessary to produce properly passivated interfaces without undergoing chemical changes. Its thermal stability on $SiO_2$, $Al_2O_3$, $ZrO_2$, $HfO_2$ and a variety of other dielectrics makes it compatible with post processing temperatures up to 1000° C. The present invention method allows the fabrication of FETs and to passivate the metal/dielectric interfaces of these FETs to better than $D_{it}=5E10/cm^2$ eV interface states.

The pFET metal gate avoids the problem of poly-Si depletion and allows for a reduction in the effective capacitance of the device gate stack. The use of a metal gate allows for a thicker gate dielectric than would otherwise be required with a poly-Si gate. At the same time, the thermal stability of these metal gate materials make them fully compatible with standard post-processing techniques, i.e. activation anneals and the like.

The electrode fabrication utilizing Re, Rh, Ir, Pt and Ru in the present invention method is achieved by using a low temperature/low pressure CVD technique with $Re_2(CO)_{10}$ as the source material when Re is to be deposited.

In a preferred embodiment, a metal oxide semiconductor device is provided which includes a semi-conducting substrate that has source and drain regions; a gate dielectric layer of less than 100 Å thickness on the semi-conducting substrate; and a gate formed of a metal selected from the group consisting of Re, Rh, Ir, Pt and Ru on top of the gate dielectric layer.

In the metal oxide semiconductor device, the gate dielectric layer may have a thickness preferably less than 50 Å. The gate dielectric layer may be formed of a material selected from $SiO_2$, nitrided $SiO_2$, $Si_3N_4$, metal oxides and mixtures thereof, or may be formed of a material selected from $Al_2O_3$, $HfO_2$, $ZrO_2$, $Y_2O_3$, $La_2O_3$ and mixtures thereof including silicates and nitrogen additions. In one specific embodiment, the dielectric layer may be formed of $SiO_2$, while the semi-conducting substrate may be formed of silicon. The semi-conducting substrate may be p-type or n-type. The semi-conducting substrate may be formed of a material selected from the group consisting of silicon, SiGe, SOI, Ge, GaAs and organic semiconductors.

The present invention is further directed to a field effect transistor that includes a semi-conducting substrate that has at least one source and one drain region; a gate dielectric layer of less than 100 Å thickness on the semi-conducting substrate; and a gate formed of a metal selected from the group consisting of Re, Rh, Ir, Pt and Ru on top of the gate dielectric layer.

In the field effect transistor, the gate dielectric layer may have a thickness preferably less than 50 Å, and may be formed of a material selected from the group consisting of $SiO_2$, nitrided $SiO_2$, $Si_3N_4$, metal oxides and mixtures thereof. The dielectric material layer may further be formed of a material selected from $Al_2O_3$, $HfO_2$, $ZrO_2$, $Y_2O_3$, $La_2O_3$ and mixtures thereof including silicates and nitrogen additions. The semi-conducting substrate may be p-type or n-type, or may be formed of a material selected from silicon, SiGe, SOI and GaAs. In one specific embodiment, the semi-conducting substrate of the FET is formed of silicon while the gate dielectric layer is formed of $SiO_2$.

The present invention is still further directed to a method for forming a metal contact in a semiconductor device which can be carried out by the operating steps of depositing a dielectric material layer of less than 100 Å thickness on an active surface of the pre-processed semi-conducting substrate; depositing a layer of metal selected from the group consisting of Re, Rh, Pt, Ir and Ru by a chemical vapor deposition method; patterning the metal layer and forming a metal electrode on the dielectric layer; and passivating the metal electrode and the dielectric layer in forming gas ($Ar/H_2$ or $N_2/H_2$).

The method for forming a metal contact in a semiconductor device may further include the step of depositing the dielectric layer by a material selected from $SiO_2$, nitrided $SiO_2$, $Si_3N_4$, metal oxides and mixtures thereof to a small thickness, preferably to less than 50 Å. The dielectric material layer may further be deposited of a material such as $Al_2O_3$, $HfO_2$, $ZrO_2$, $Y_2O_3$, $La_2O_3$ or mixtures thereof including silicates and nitrogen additions. The method may further include the step of depositing a metal layer of Re by using $Re_2(CO)_{10}$ as a source material by the chemical vapor deposition technique. The method may further include the step of passivating the metal electrode and the dielectric material layer by annealing in forming gas. The method may further include the step of passivating the metal electrode and the dielectric material layer in a high pressure hydrogen process. The method may further include the step of depositing the metal layer in a substantially uniform thickness, or having a thickness variation of less than 10% across the semi-conducting substrate.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for fabricating a CMOS gate electrode incorporating Re, Rh, Pt, Ir or Ru metal. The work functions of these metals make them compatible with current p-FET requirements. The requirements of the p-FET gate material, presented below, are divided into four sections of deposition techniques, physical characterization, electrical characterization and integration.

Deposition Techniques

The Re electrode fabrication in the present invention is achieved by using a low temperature/low pressure CVD technique with $Re_2(CO)_{10}$ as the source material. Specifically, the method of the present invention comprises the steps of (a) depositing a uniform layer of Re directly onto a dielectric material such as an ultra-thin gate dielectric material, the dielectric material being positioned on a semiconductor substrate, the deposition is carried out by CVD using $Re_2(CO)_{10}$ as the source material under conditions which are sufficient to form the Re layer; and (b) patterning the structure formed in step (a) using simple patterning process including Al deposition and selective wet etching of the structure or standard lithographic techniques to form a test capacitor or MOS transistor containing the p-channel Re gate on the dielectric material. It is emphasized that no chemical activation step is required in the present invention method to deposit the Re layer onto the dielectric material. The present invention also provides MOS devices such as FETs which include at least one p-channel Re gate prepared in accordance with the method of the present invention. The devices of the present invention exhibit gate leakage comparable to prior devices prepared in accordance with existing technology and they exhibit the accepted values for metal-gate work functions. In accordance with a preferred embodiment of the present invention, the Re electrode is fabricated by a method which includes the steps of:

(A) depositing a layer of Re onto a dielectric material, wherein the deposition is carried out by chemical vapor deposition (CVD) using $Re_2(CO)_{10}$ as a source material;

(B) patterning the Re layer to form the Re electrode on the dielectric material; and (C) passivating Re and dielectric materials using conventional forming gas annealing or high pressure hydrogen to produce a very low interface charge density device structure.

The present invention provides a method for fabricating p-channel Re gates directly onto dielectric materials which are present on MOS devices. The p-channel Re gates produced in accordance with the present method are compatible with ultra-thin gate dielectric materials found on MOS; devices and have resistivity values no greater than 3× of the ideal bulk value at a film thickness of 100 nm.

In accordance with the method of the present invention, a layer of Re is directly deposited on the surface of a dielectric material which is on top of a semiconductor substrate by employing CVD using $Re_2(CO)_{10}$ as the source material under conditions which are sufficient to form Re layer on the dielectric material. The structure containing the Re layer is then patterned using conventional techniques known to those skilled in the art.

The CVD apparatus includes a load-locked, coldwall stainless steel reactor which includes a graphite sample holder cartridge. The reactor further includes a boron nitride heater assembly for heating the sample during deposition and two ultra-high vacuum turbo-molecular pumps for controlling the pressure during the deposition providing base pressure of $10^{-7}$ torr. The method, however, is not restricted by the method of heating or the material comprising the heater or the nature of the sample holder.

The source material dirhenium decacarbonyl ($Re_2(CO)_{10}$) is introduced into reactor chamber via a stainless steel valve and is directed to a test wafer which is contained within the reactor. The source material, $Re_2(CO)_{10}$, which is a white solid, is contained in a glass tube and maintained at a constant temperature ranging from 20° C. to 70° C. during the deposition. The precursor is delivered by using Ar (or any inert gas) as a carrier gas and the chamber pressure during growth is controlled by the flow of the Ar carrier gas and the substrate temperature.

CVD of $Re_2(CO)_{10}$ occurs at temperatures from about 300° C. to about 550° C. More preferably, the CVD deposition of Re occurs at a temperature from about 350° C. to about 450° C. The total pressure of the reactor (precursor and carrier gas) during CVD is about 3 E-2 torr. The CVD) process typically is carried out for a time period of from about 10 minutes to about 5 hrs. Higher deposition rates can be achieved by using higher precursor temperatures and higher carrier gas flow.

It is noted that under the above conditions, a layer of having a thickness of from about 2 nm to about 200 nm, more preferably from about 20 nm to about 100 nm is deposited directly the dielectric material.

The ultra-thin dielectric materials employed in the present invention include $SiO_2$, nitrided $SiO_2$, $Si_3N_4$, metal oxides and mixtures or combinations thereof. The dielectrics employed in the present invention may be grown, deposited or reacted by using techniques known to those skilled in the art. Of the gate dielectric materials mentioned herein above $SiO_2$, lightly nitrided $SiO_2$ (5% or less total nitride content), $Al_2O_3$, $HfO_2$, or $ZrO_2$, $Y_2O_3$, are preferred.

After depositing the Re layer, the samples are patterned using Al as hard masks or standard lithographic techniques known to those skilled in the art. This includes positioning photoresists on the surface of the CVD Re layer; developing the photoresists and removing, via etching techniques, those areas that do not contain the photoresists. Etching may be carried out using wet or dry techniques well known to those skilled in the art. When wet etching is employed, the chemical etchant is selected from the group consisting of $H_2O_2$, chromic acid, phosphoric acid, acetic acid, and the like thereof. The preferred chemical etchant employed in the present invention is $H_2O_2$. When dry chemical etching is employed in the present invention, it may be carried out by reactive ion etching (RIE), ion beam etching (IBE) or laser ablation.

Test specimens were fabricated using thermally grown silicon dioxide thin films having thicknesses ranging from 2 nm to 20.0 nm for formation of MOS capacitors. Additional experiments were performed on device structure wafers containing dielectric thicknesses from 1 nm to 2 nm and on $Al_2O_3$ layers grown by molecular beam epitaxy. Films were grown on p-type or n-type wafers with resistivities between about 0.1 ohm-cm to about 0.2 ohm-cm. Re films were deposited on the test wafers in blanket fashion. Specifically, Re depositions were carried out in a load-locked stainless steel reactor with a base pressure of about $10^{-7}$ torr. Dirhenium decacarbonyl, $Re_2(CO)_{10}$, was used as the source gas and admitted into the reactor via a stainless steel valve and directed onto the sample. The precursor delivery rate was controlled by using Ar as a carrier gas. The samples were introduced on a graphite sample holder cartridge which in turn was introduced into a heater assembly located within the reactor chamber. The deposition was conducted in a temperature range of 200° C.-550° C. The growth rate in the system was typically about 0.1 to 1.5 nm/minute depending on precursor and deposition temperature.

Physical Characterization

Depending on the integration scheme, thermal stability (preferably up to 1000° C.) from agglomeration, from reaction with the dielectric (formation of an interlayer between the gate metal and the dielectric) and reaction with the annealing ambient (forming gas (FO) or hydrogen (H)) is required of the metal gate material. A second requirement is low resistivity, 1~2 milliOhm-cm for the gate contact and more preferably, lower than 50 micro-Ohm-cm for gate contact plus local interconnect use (similar to that with silicides). Rhenium has a resistivity lower than 50 micro-Ohm-cm after a 1000° C. FG anneal treatment on both $SiO_2$ and $Al_2O_3$ dielectrics.

Figure 1A:
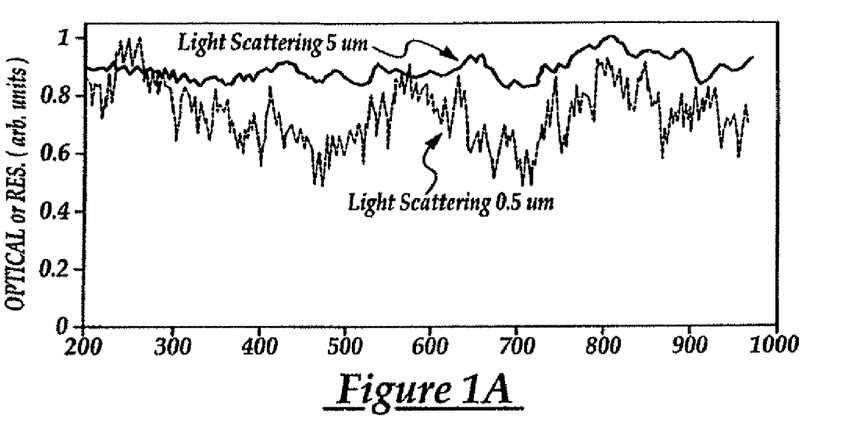
FIG. 1A is a graph illustrating the results of optical scattering analysis during annealing of a 50 nm CVD Re film on 500 nm $SiO_2$ in forming gas at 3° C./Sec up to 1000° C. to determine changes in surface roughness or index of refraction.
Figure 1B:
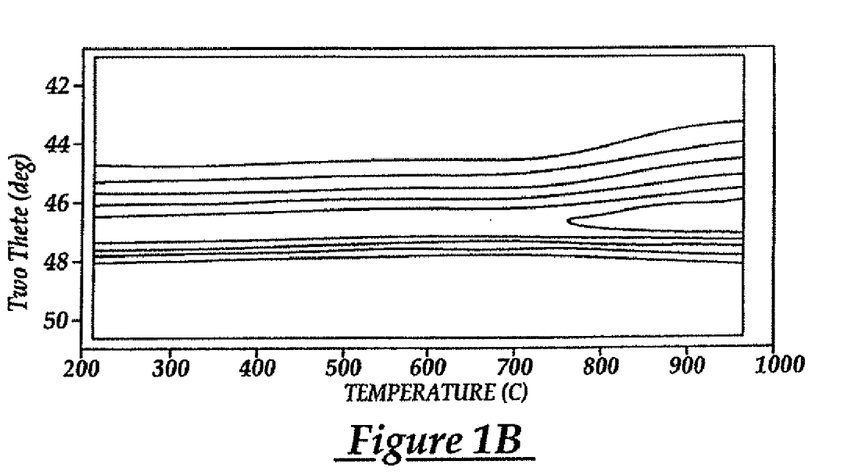
FIG. 1B is a graph of a contour plot of detraction versus temperature that follows the (002) orientation of Re on $SiO_2$ during annealing in forming gas at 3° C./sec up to 1000° C.
Figure 2A:
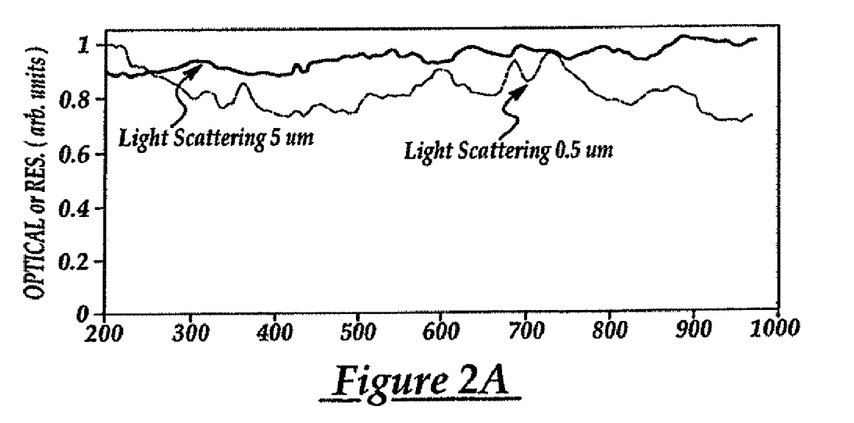
FIG. 2A is a graph illustrating the results of optical scattering analysis conducted during annealing of a 30 nm PVD Re film on 300 nm $Al_2O_3$ in a forming gas at 3° C./Sec up to 1000° C. to determine changes in surface roughness or index of refraction.
Figure 2B:
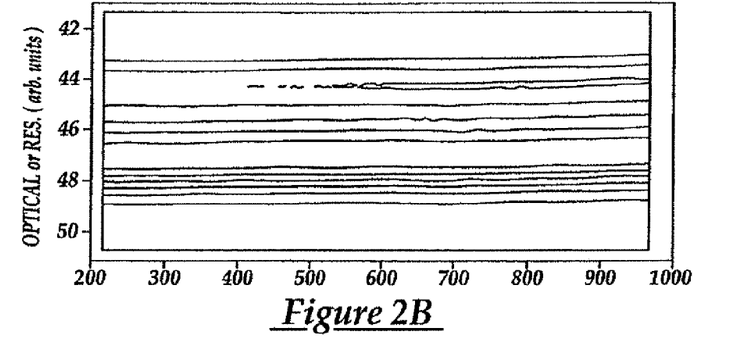
FIG. 2B is a graph of a contour plot of detraction angle versus temperature that follows the (002) orientation of Re on $Al_2O_3$ during annealing in forming gas at 3° C./sec up to 1000° C.

The thermal stability of various gate materials in contact with both $SiO_2$ and $Al_2O_3$ dielectrics was investigated using three techniques employing a synchrotron light source. The techniques include time resolved x-ray diffraction analysis used to determine if the metal electrode undergoes an interaction with the dielectric layer or FG annealing ambient, optical scattering and resistance analysis as a function of temperature used to determine if the film undergoes agglomeration or thermal degradation. All three techniques were monitored simultaneously while the samples were heated from 100° C. to 1000° C. in FG. It was determined that for the stack of 30 nm Re, Rh, Pt or Ir on 500 nm $SiO_2$ or 300 nm $Al_2O_3$, there was no thermal degradation or reactions during the anneal treatments. FIGS. 1 and 2 show the results from a 50 nm CVD Re/500 nm $SiO_2$ and 30 nm PVD Re/300 nm $Al_2O_3$ stack annealed to 1000° C. in FG. FIGS. 1a and 2a show that no changes occur in the optical scattering signal indication that the metal surface remains smooth during the anneal treatment.

FIG. 1A shows the optical scattering analysis at two different lateral length scales (0.5 and 5 micro meters). Changes indicate surface roughness developing in the film leading to thermal degradation. In this case no changes are seen indicating the film is not agglomerating. FIG. 1B shows the results from annealing a 50 nm CVD Re film on 500 nm $SiO_2$ in FG at 3° C./sec up to 1000° C. The contour plot (diffraction angle vs. temperature with scale indicating x-ray intensity, upper and lower regions of lowest intensity and center region highest intensity) follows the (002) orientation of Re as a function of temperature. Notice the peak moves linearly to lower angles on annealing due to lattice expansion and at about 750° C., the intensity increases indicating grain growth in the film. There are no indication of additional peaks or a decrease in intensity of the (002) peak which would signify a reaction with the dielectric or annealing ambient.

FIG. 2A shows the optical scattering analysis at two different lateral length scales (0.5 and 5 micro meters). Changes would indicate surface roughness developing in the film leading to thermal degradation. In this case, no changes are seen indicating the film is not agglomerating. FIG. 2B shows the results from annealing a 30 nm PVD Re film on 300 nm $Al_2O_3$ in FG at 3° C./sec up to 1000° C. The contour plot (diffraction angle vs. Temperature with color scale indicating x-ray intensity, top and bottom regions lowest intensity and center region highest intensity) follows the (002) orientation of Re as a function of temperature. Notice the peak moves linearly to lower angles on annealing due to lattice expansion. There are no indications of additional peaks or a decrease in intensity of the (002) peak which would signify a reaction with the dielectric or annealing ambient.

The time resolved techniques employed did not show any indication of thermal degradation or reactions for the Re, Rh, Pt and Ir gate materials in contact with $SiO_2$ or $Al_2O_3$. The time resolved x-ray diffraction technique would only be sensitive to a reaction between the gate metal and the dielectric which forms an interlayer greater than about 4-5 nm in thickness. As a finer check to determine if there was an interaction at the interface, x-ray reflectivity analysis was used. With this technique, roughness changes at the metal—dielectric interface on the order of a few angstrom's can be detected which would indicate an interaction. The technique also allows the determination of thickness changes in the layers present and in that manner, if the dielectric layer gets thinner or if an interlayer forms this would indicate an interaction between the metal and the dielectric. A further result this technique provides is an indication of the surface roughness of the films. Table 1 summarizes the results. It is noted that as-deposited, the CVD Re films have a 6-7 times higher surface roughness compared to PVD. After a 450° C./30 min. Forming gas anneal treatment, the interface roughness of the Re, Rh and Ir samples increase only slightly indicating very little interaction between the metal and dielectric. The Pt film actually became smoother after the FG anneal treatment. For the Re films on both $SiO_2$ and $Al_2O_3$ there was no change in the dielectric thickness after the FO anneal treatment. These results again confirm that there is no interaction between Re, Rh, Pt and Ir gate metal materials and the dielectric after a 450° C. FG anneal treatment. As an example of interlayer formation, if titanium, a very reactive material, is used as the gate metal on $SiO_2$, after the FG anneal treatment, an interlayer is clearly seen indicating a reaction between the metal and the dielectric.

TABLE I

Interface Roughness Surface

| Material | Roughness as dep. | Interface Roughness After anneal (FG 450° C./30 min.) | Comments |
|---|---|---|---|
| CVD Re/$SiO_2$ | σ~30-40 Å | Re slightly rougher | no change in $SiO_2$ thickness |
| PVD Rre/$Siso_2$ | σ~7 Å | Re slightly rougher | no change in $SiO_2$ thickness |
| CVD Re/$Al_2O_3$ | σ~43-49 Å | Re slightly rougher | no chane in $Al_2O_3$ |
| PVD Re/$Al_2O_3$ | σ~8-9 Å | Re slightly rougher | |
| PVD Rh/$SiO_2$ | | Re slightly rougher | |
| Ir/$SiO_2$ | | Ir slightly rougher | |
| Pt/SIO2 | | Pt slightly rougher | |

Figure 3A:
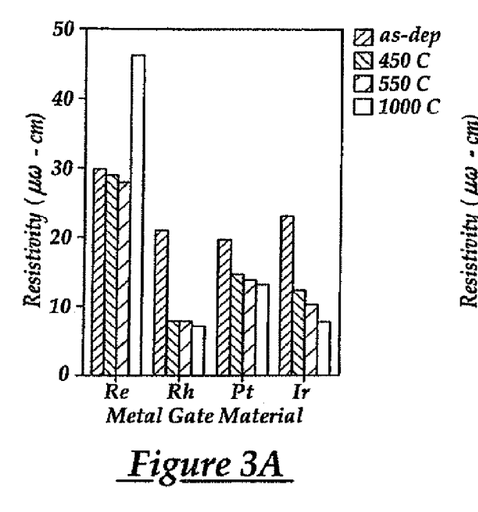
FIG. 3A is a graph showing that PVD 30 nm films of Re, Rh, Pt and Ir deposited on $SiO_2$ after undergoing various thermal treatments in a forming gas at 3° C./Sec to 450° C., 550°, 750° and 1000° C., maintain resistivities below 50 micro-Ohm-cm.
Figure 3B:
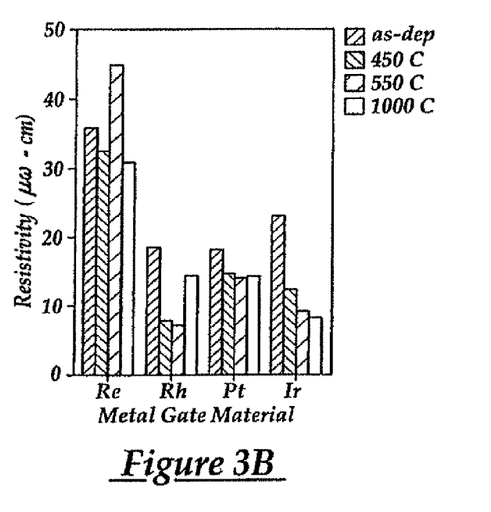
FIG. 3B is a graph similar to FIG. 3A but on a $Al_2O_3$ substrate, instead of on $SiO_2$.

FIGS. 3A and 3B show that PVD 30 nm films of Re, Rh, Pt, and Ir after undergoing various thermal treatments (annealing in FG at 3° C./sec to 450° C., 550° C., 750° C., and 1000° C.) maintain resistivities below 50 micro-Ohm-cm. FIG. 3A shows the results for films deposited on 500 nm $SiO_2$ and FIG. 3B on a 300 n $Al_2O_3$ dielectric. These results indicate that the films are thermally stable and can be used in a standard high temperature integration scheme not only as the gate contact but also as local interconnects.

Figure 4A:
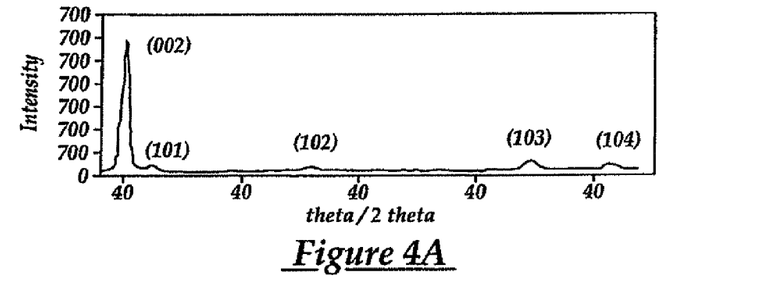
FIG. 4A shows a standard theta/two theta x-ray detraction diffractogram indicating a strong Re (002) textured peak at about 40.5° two theta.
Figure 4B:
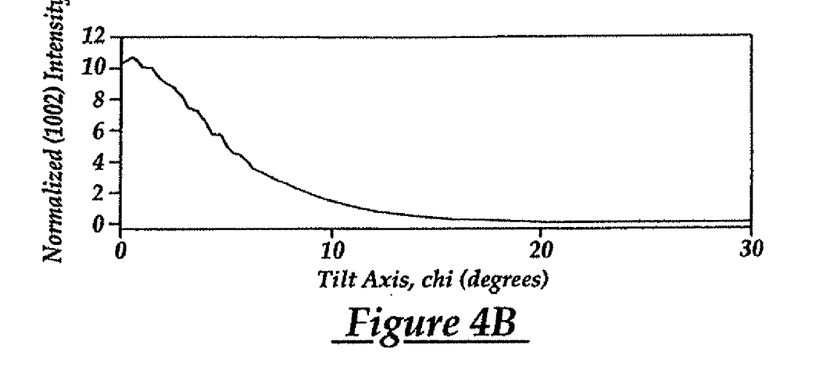
FIG. 4B is a graph showing a chi scan (fiber plot) further indicating the textured nature of the Re film.

The CVD deposited Re films on $SiO_2$ show strong (002) texture by an x-ray diffraction analysis. The textured films were observed independent of growth temperature for films with thicknesses less than 100 nm, FIG. 4A shows a standard theta/two theta x-ray diffraction diffractogram which indicates the strong Re (002) textured peak at about 40.5° two theta. FIG. 4B shows a chi scan (fiber plot) further indicating the highly textured nature of the film.

Electrical Characterization

For a gate metal PFET contact, a work function within 0.2 eV from the silicon valence band edge (Ev) is necessary. The work function for the Re metal gate material was established between 4.6 eV and 5.0 eV. Besides the work function, another important consideration is the interface trapped charge which can be minimized after deposition by a hydrogen anneal treatment. The conventional treatment is a FG anneal but a new process using 400 torr of hydrogen and 350° C. has shown superior results. For the Re gate metal, the interface trapped charge (Dit) was reduced to 3~4 E 10/$cm^2$ $eV^1$ with the use of high hydrogen pressures necessary to produce properly passivated interfaces without causing the material to undergo chemical changes.

After deposition of the Re films, capacitors were patterned using evaporated 60 nm thick Al dots as a hard mask for wet etching. The rhenium film was wet-etched using $H_2O_2$. Capacitor structures were thus formed with areas ranging from about 1 E-6 to about 1 E-2 $cm^2$. Additionally, Re films were patterned by wet etching using standard lithography techniques for device structure wafers.

Figure 5:
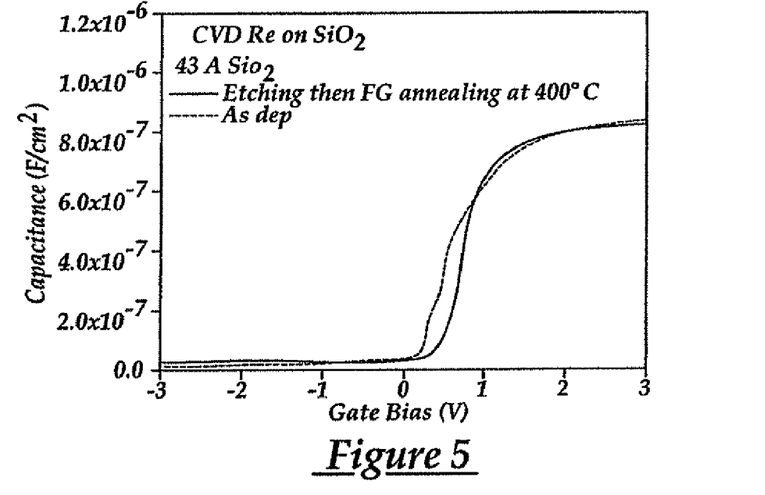
FIG. 5 is a graph illustrating typical C-V data for an Re capacitor structure formed with an $SiO_2$ thickness of about 4.3 nm as-deposited and after a 400° C. forming gas anneal.

The Re film capacitors were tested using high frequency and quasi-static capacitance-voltage (C-V) and current voltage (I-V) techniques. FIG. 5 shows typical C-V data for Re gate capacitor structures formed on an $SiO_2$ dielectric which had a thickness of about 4.3 nm. Data is shown for capacitors formed on n-type silicon wafers. The dotted and solid lines show the C-V data before and after a standard post metal gate deposition forming gas anneal (FGA) step which is carried out in 10% H in nitrogen at 400° C. for about 30 minutes.

Analysis of the C-V data shows interface state densities in the low 3~4 E11 $cm^{-2}$ $eV^{-1}$ for samples subjected to FGA. The as-deposited sample has some defect states as seen in FIG. 5, which can be removed by a standard FGA step. C-V data were obtained for other Re capacitors with dielectric thickness ranging from 2~20 nm and the work function was determined to be 5.0 eV. This, in itself, demonstrates that the Fermi-level of the metal gate is situated very close to silicon valence band edge indicating that Re is an appropriate choice for p-FET MOS structure.

Figure 6:
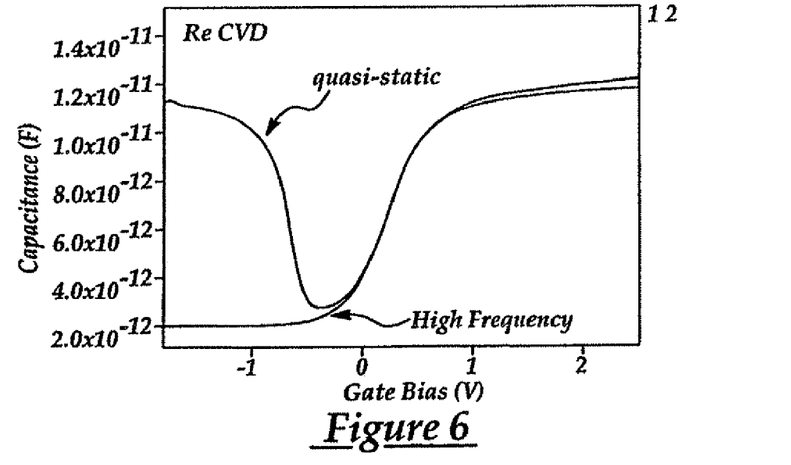
FIG. 6 is a graph illustrating typical high frequency and quasi-static C-V data for an Re capacitor structure that has an oxide thickness of about 20 nm after a high pressure hydrogen annealing process.

Although the conventional FGA produces an acceptable range of interface state densities, it can be improved by using newly developed high pressure $H_2$ annealing process. The process is performed in a load lock chamber using a He lamp heater. The patterned samples are loaded in the chamber and maintained at 350° C. and high pressure $H_2$ is introduced, typically 400 torr for 30 minutes. By this process, the interface state densities are reduced to (3~4) E 10 $cm^{-2}$ $eV^{-1}$. FIG. 6 shows typical high frequency and quasi-static C-V data for Re capacitor structures having an oxide thickness of about 20 nm after the high pressure annealing process.

Figure 7:
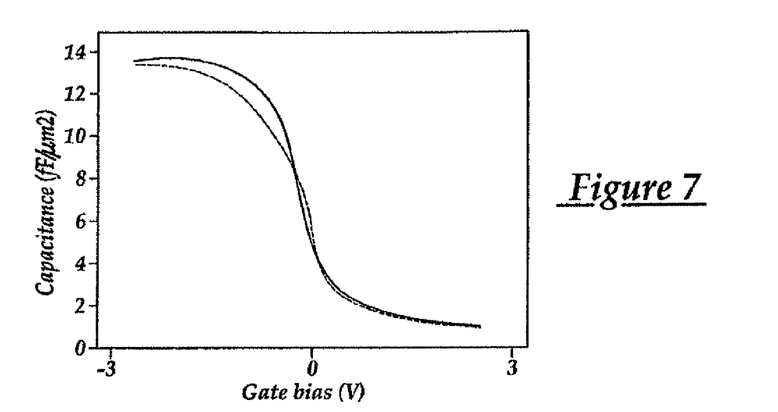
FIG. 7 is a graph illustrating C-V data for an Re capacitor structure that has an $SiO_2$ thickness of 2 nm as-deposited and after a forming gas anneal treatment.
Figure 8:
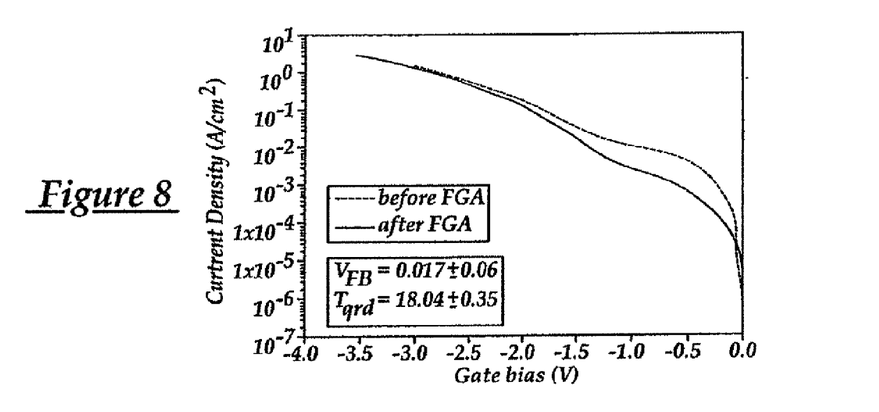
FIG. 8 is a graph illustrating I-V data for an Re capacitor structure that has an $SiO_2$ thickness of 2 nm as-deposited and after a 400° C. forming gas anneal.

C-V and I-V data for capacitor device structures employing Re having an oxide thickness of 2 nm are shown in FIGS. 7 and 8. The dotted and solid lines show the C-V and I-V data before and after a standard FGA step. These data demonstrate that the Re capacitors function on thin 2 nm gate dielectrics and have leakage currents as low as those of standard polysilicon based capacitors.

Figure 9:
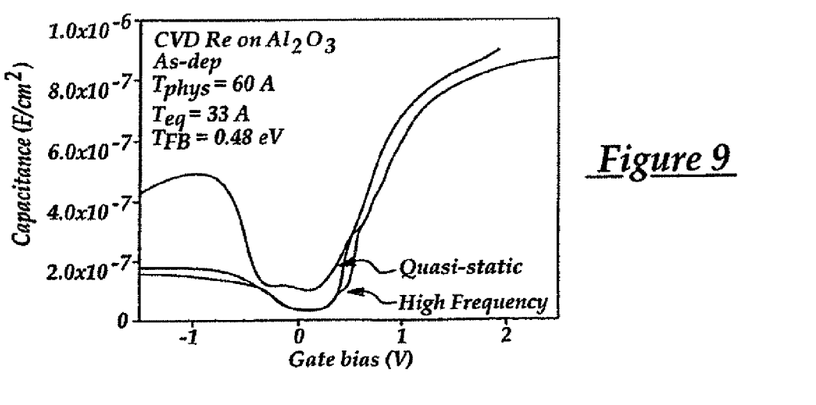
FIG. 9 is a graph illustrating C-V data for an Re capacitor structure formed on an $Al_2O_3$ dielectric that has a thickness of about 6 nm.

FIG. 9 shows C-V data for Re capacitor structures formed on $Al_2O_3$ dielectrics having a thickness of about 6 nm. The capacitor is formed on an n-type silicon wafer. The flat band voltage was about 0.48 eV, which is essentially the same as on $SiO_2$. This indicates that Re can be used as an electrode material for p-channel metal gates using $Al_2O_3$ as the dielectric. FIG. 9 is a high frequency and quasi-static capacitance-voltage plot for a Re capacitor structure formed in accordance with the present invention on an $Al_2O_3$ film having a thickness of 6 nm after the FGA.

Integration

The integration scheme chosen determines the maximum temperature the gate metal/dielectric will have to withstand.

1. For a standard CMOS process for which the dielectric and poly-Si contact are in place before the source and drain activation anneals, the stack will have to withstand 1000° C. thermal treatments. For at least a few seconds, as mentioned above, Re, Rh, Pt, Ir and Ru can withstand such treatments without thermal degradation.

2. Two additional possible integration schemes include having the metal/dielectric combination in place before source and drain silicide formation but not before the activation anneals. In this case the combination would have to withstand anneal treatments at 750° C. for $CoSi_2$ formation.

3. In the last integration scheme the standard process is followed (i.e. poly-Si flow). After the stack is built, the poly-Si is etched away and the dielectric deposited followed by the metal fill (CVD process) into the damascene feature. Chemical mechanical polishing (CMP) is then used to planarize the structure. In this scheme the maximum processing temperature is 400° C.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming a metal contact in a semiconductor device comprising:
   depositing a dielectric material layer of less than 100 Å thickness on an active surface of a pre-processed semiconducting substrate;
   depositing a layer of metal from a $Re_2(CO)_{10}$ CVD precursor by a chemical vapor deposition method, wherein depositing the layer of the metal occurs at temperatures from about 300° C. to about 550° C.;
   patterning said metal layer and forming a metal electrode on said dielectric layer; and
   passivating said metal electrode and said dielectric layer in a hydrogen anneal to provide an interface trapped charge density in the semiconductor device ranging from 3E10 $cm^{-2}eV^{-1}$ to 4E10 $cm^{-2}eV^{-1}$.

2. A method for forming a metal contact in a semiconductor device according to claim 1 further comprising the step of depositing said dielectric layer by a material selected from the group consisting of $SiO_2$, nitrided $SiO_2$, $Si_3N_4$, metal oxides and mixtures thereof.

3. A method for forming a metal contact in a semiconductor device according to claim 1 further comprising the step of depositing said dielectric material layer in a thickness less than 50 Å.

4. A method for forming a metal contact in a semiconductor device according to claim 1 further comprising the step of depositing said dielectric material layer by a material selected from the group consisting of $Al_2O_3$, $HfO_2$, $ZrO_3$, $Y_2O_3$, $La_2O_3$ and mixtures thereof including silicates and nitrogen additions.

5. A method for forming a metal contact in a semiconductor device according to claim 1 further comprising the step of depositing said metal layer in a substantially uniform thickness, having a thickness variation of less than 10% across said semi-conducting substrate.

6. A method of forming a metal oxide semiconductor (MOS) device comprising:
   providing a semiconducting substrate having source and drain regions;
   forming a gate dielectric of less than 100 Å thickness on said semiconducting substrate, said gate dielectric is selected from the group consisting of $HfO_2$, $ZrO_3$, $Y_2O_3$, silicates or nitrogen additions of $HfO_2$, $ZrO_3$, or $Y_2O_3$, and mixtures thereof; and
   forming a gate of a metal comprising Re on top of said gate dielectric, said gate comprising Re derived from a $Re_2(CO)_{10}$ CVD precursor, in which a deposition temperature for the forming of the gate ranges from about 300° C. to about 550° C.; and
   passivating the gate of the metal electrode and the gate dielectric in a hydrogen anneal to provide the gate with an interface trapped charge density in the semiconductor device ranging from 3E10 $cm^{-2}eV^{-1}$ to 4E10 $cm^{-2}eV^{-1}$.

7. The method of claim 6, wherein said gate dielectric has a thickness of less than about 50 Å.

8. The method of claim 6, wherein said semiconducting substrate is p-type or n-type.

9. The method of claim 6, wherein said semiconducting substrate is formed of a material selected from the group consisting of silicon, SiGe, SOI, Ge, GaAs, and organic semiconductors.

10. The method of claim 6, wherein said semiconducting substrate is formed of silicon.

11. The method of claim 6, wherein the gate of the metal comprising Re is vertically abutting the gate dielectric.

12. The method of claim 6, wherein the forming of the gate of the metal comprising Re comprises a chemical vapor deposition method.

13. The method of claim 6, wherein the $Re_2(CO)_{10}$ CVD precursor is a solid maintained at a substantially constant temperature ranging from about 20° C. to about 70° C. during the forming of the gate.

14. The method of claim 6, wherein the $Re_2(CO)_{10}$ CVD precursor is delivered using an inert gas as a carrier.

15. The method of claim 6, wherein the forming of the gate occurs at a total pressure of about $3 E^{-2}$ torr.

16. The method of claim 6, wherein the forming of the gate occurs during a time period of from about 10 minutes to about 5 hrs.

17. The method of claim 1, wherein the pressure of the hydrogen anneal is on the order of approximately 400 Torr.

18. The method of claim 6, wherein the pressure of the hydrogen anneal is on the order of approximately 400 Torr.

* * * * *